United States Patent [19]

McClelland

[11] Patent Number: 5,851,725

[45] Date of Patent: Dec. 22, 1998

[54] EXPOSURE OF LITHOGRAPHIC RESISTS BY METASTABLE RARE GAS ATOMS

[75] Inventor: Jabez McClelland, Bethesda, Md.

[73] Assignee: The United States of America as represented by the Secretary of Commerce, Washington, D.C.

[21] Appl. No.: 8,976

[22] Filed: Jan. 26, 1993

[51] Int. Cl.$^6$ .................................................. G03C 5/00
[52] U.S. Cl. ........................................... 430/269; 430/326
[58] Field of Search .................................... 430/269, 326; 156/643

[56] References Cited

U.S. PATENT DOCUMENTS

| | | | |
|---|---|---|---|
| 4,238,706 | 12/1980 | Yoshihara et al. | 378/34 |
| 4,515,876 | 5/1985 | Yoshihara et al. | 430/324 |
| 4,574,198 | 3/1986 | Lucas et al. | 250/493.1 |
| 4,615,756 | 10/1986 | Tsujii et al. | |
| 4,703,166 | 10/1987 | Bruning | 250/203.1 |
| 4,720,469 | 1/1988 | Keser et al. | 438/558 |
| 4,746,799 | 5/1988 | McMillan | 313/359.1 |
| 4,773,750 | 9/1988 | Bruning | 353/122 |
| 4,785,192 | 11/1988 | Bruning | 250/548 |
| 4,883,352 | 11/1989 | Bruning | 353/122 |
| 4,972,244 | 11/1990 | Buffet et al. | 257/442 |
| 4,974,227 | 11/1990 | Saita et al. | 372/29 |
| 5,002,632 | 3/1991 | Loewenstein et al. | |
| 5,038,082 | 8/1991 | Arita et al. | 315/326 |
| 5,074,955 | 12/1991 | Henry et al. | 438/504 |
| 5,078,833 | 1/1992 | Kadomura | 438/696 |

OTHER PUBLICATIONS

Brand, J.A. et al, "Production of a high-density state-selected metastable neon beam"; *American Institute of Physics*, Jan. 1992 pp. 163–165.

Balykin, V.I. et al., "Laser Optics of Neutral Atomic Beams", *Physical Today*, Apr. 1989, pp. 23–28.

"Optics' New Focus: Beams of Atoms", *Research News*, Mar. 1992, pp. 1513–1515.

Carnal, O. et al. "Imaging and Focusing of Atoms by a Fresnel Zone Plate", *The American Physical Society*, 2 Dec. 1991, vol. 67, No. 23, pp. 3231–3234.

Nacher, P.J. et al.; "Optical pumping in $^3$He with a laser", *Journal de Physique*, No. 12, pp. 2057–2073.

Bubert, W., "Preparation of Polarized Excited Rare Gas Atom States R($np^5(n+1)s$) and R($np^5(n+1)p$) by Laser Optical Pumping", *Atoms, Molecules and Clusters 1*, pp. 321–330 (1986).

Lynn, J.G. et al., "Optical pumping of rare–gas metastable atom beams with a frequency–modulated multimode dye laser", *Applied Optics*, vol. 25, No. 13, 1 Jul. 1986, pp. 2154–2157.

Balykin, V.I., "Focusing of an atomic beam and imaging of atomic sources by means of a laser lens based on resonance–radiation pressure", *Journal of Modern Optics*, 1988, vol. 35, No. 1, pp. 17–34.

Prodan, John V. et al., "Laser Production of a Very Slow Monoenergetic Atomic Beam", *Physical Review Letters*, vol. 49, No. 16, 18 Oct. 1982, pp. 1149–1153.

Sheehy, B. et al, "Magnetic–Field–Induced Laser Cooling below the Doppler Limit", *Physical Review Letters*, vol. 64, No. 8, 19 Feb. 1990, pp. 858–861.

Riis, Erling et al., "Atom Funnel for the Production of a Slow, High–Density Atomic Beam", *Physical Review Letters*, vol. 64, No. 14, 2 Apr. 1990, pp. 1658–1661.

McClelland, J.J. et al., "Laser focusing of atoms: a particle–optics approach", *Journal of the Optical Society of America B*, vol. 8, No. 9 Sep. 1991, pp. 1974–1986.

*Primary Examiner*—M. Nuzzolillo
*Assistant Examiner*—L. S. Werner
*Attorney, Agent, or Firm*—Larson and Taylor

[57] ABSTRACT

A lithography process which utilizes metastable atoms for resist exposure is disclosed. Metastable rare gas atoms, instead of photons, electrons or ions, are directed at the surface of a lithographic resist. On impact, the metastable atoms release up to 20 eV of energy per atom in the form of secondary electrons. These secondary electrons alter chemical bonds in the resist, causing it to become either soluble or insoluble in an appropriate developer solution. The metastable rare gas atoms can further be manipulated with the new techniques of atom optics to focus them, improve their collimation and intensity, or modulate them.

5 Claims, 2 Drawing Sheets

EXPOSURE OF LITHOGRAPHIC RESISTS BY METASTABLE RARE GAS ATOMS

FIELD OF THE INVENTION

The present invention is generally related to lithography processes and, more particularly, to a method of exposing lithographic resists using metastable rare gas atoms.

BACKGROUND OF THE INVENTION

Microcircuit fabrication is presently a multi-billion dollar industry. In typical fabrication processes, a lithographic resist is first applied in a very thin film to the surface of a substrate. The resist is then exposed to photons, electrons or ions to produce a pattern. In contact lithography, a patterned mask is placed in front of the resist. The pattern is then transferred to the resist upon exposure. In projection lithography, an image of the mask is projected onto the surface of the resist, while in electron or ion beam lithography, a finely focused spot of particles is scanned across the surface to make a pattern in the resist. Irrespective of whether photons, electrons or ions are utilized, patterning occurs through the generation of secondary electrons by the incident particles which enter the resist and induce chemical bond-breaking or crosslinking in the resist material. The chemical alterations in the resist make the exposed portions of the resist either soluble (positive resist) or insoluble (negative resist) in a suitable developer solution. After development, the wafer is usually etched to generate the desired pattern. The resist is then removed, and the patterns serve as building blocks for the electronic devices (e.g., transistors, diodes, resistors or capacitors) which comprise the microchip.

In recent years, there has been an ever-increasing demand for higher resolution lithography to enable the fabrication of more integrated circuity. However, the ability to reduce the size of features has been limited due to various drawbacks associated with the prior art lithography processes. Diffraction, for example, limits the smallest spot size attainable to about one half the wavelength of the incident radiation. Thus, visible light has a limit of 200–300 nm, and UV light has a limit of about 100 nm. X-ray lithography provides somewhat higher resolution due to the very short wavelength of x-rays; however, the practical limit is still only about 30 nm. Yet another drawback is that when, using current manufacturing devices, the closest a mask can be brought to the surface of a resist is about 1 micrometer. Thus, the incident beam of x-rays must be collimated to better than 3 mrad, assuming the collimation contribution to the spot size is 10% of the total. While such a collimation is possible, it can only be attained at the expense of x-ray intensity and, hence, at the expense of exposure time and safer throughput.

Unlike UV and x-ray lithography, diffraction does not limit the resolution of electron and ion beam lithography because De Broglie wavelengths are typically on the order of 0.001–0.01 nm. In electron and ion beam lithographies, an electron or ion beam is typically accelerated to 10–100 keV and focused to a spot, which is scanned across the resist in the desired pattern. High energies are used to minimize both the inherent aberrations associated with charged particle optics, and also space charge effects and anomalous energy spreading. However, while spot sizes of less than a nanometer can be obtained with electrons at these high energies, the resulting resist exposure is usually larger than the spot size because the incident particles have such high energies that they tend to scatter within the resist over a relatively large area. Therefore, feature size limits are about 2 nm for electron beam lithography, and 20 nm for ion beam lithography.

SUMMARY OF THE INVENTION

Metastable rare gas atoms are used as a source of energy for exposure of a lithographic resist. When focused, a beam of metastable atoms provides a spot size as small as 1.3 nm, which is comparable to state of the art electron beam technology. In another embodiment of the invention, the metastable atom-based lithographic processes are used in combination with techniques for manipulation of neutral atom beams, known as atom optics, for improved resolution.

DESCRIPTION OF THE INVENTION

Figure 1:
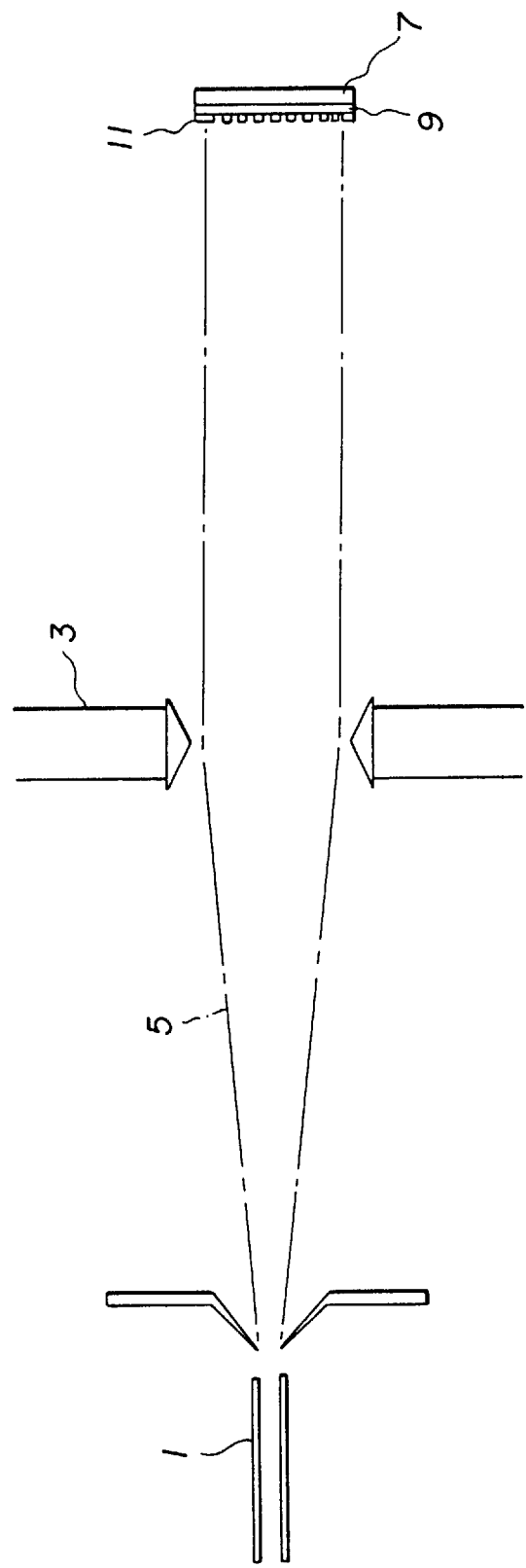
FIG. 1 shows a scanned lithography process using metastable rare gas atoms.

The present invention provides a method of using metastable rare gas atoms in lithographic processes. When a metastable rare gas atom strikes the surface of a lithographic resist, it decays with a probability between about 0.5 and 1.0 depending on details of the surface interaction, such as incident energy and angle at which the rare gas atom strikes the surface, chemical structure of the surface, and local contamination of the surface. The decay of the metastable atom causes the release of its internal energy, resulting in the generation of secondary electrons, in much the same manner as any particle with an equivalent amount of kinetic energy. The rare gases all have long-lived metastable states of 20.6 eV for He, 16.9 eV for Ne, 11.8 eV for Ar, 10.6 eV for Kr, and 9.6 eV for Xe.

According to the method of the present invention, a substrate comprised of silicon or other suitable conductive or nonconductive material is coated with a lithographic resist. The thickness of the resist layer ranges from 50 nm to 1 $\mu$m, depending on such factors as the composition of the resist, type of exposure being used, and desired depth of etching. The resist is then patterned through exposure to a beam of metastable rare gas atoms directed toward the surface of the workpiece. The metastable atoms are typically generated in a DC discharge flowing through a 0.1 mm nozzle, whereby fluxes of up to $4 \times 10^{14}$ atoms-sr$^{-1}$-s$^{-1}$ are achieved. Exposure times may range from 10 seconds to 1 hour, and are dependent on dosage, which is measured in terms of metastable atoms per square centimeter (metastable atoms - cm$^{-2}$) and refers to the number of particles striking the surface of a resist per unit area. Dosage is generally $10^{13}$ to $10^{14}$ metastable atoms - cm$^{-2}$.

The lithographic resists utilized in the method of the present invention are typically polymer formulations applied in a very thin film to the surface of the substrate to be patterned. A wide range of commercial proprietary resist formulations are available from companies such as Shipley, Olin, Ciba-Geigy, and Cyantek. In most cases, resists are specifically formulated to be most sensitive to one or another of the types of radiation used. While the sensitivity of a resist is easily measured in J-m$^{-2}$ for photoresists, or C-cm$^{-2}$ for electron beam resists, the sensitivity of a particular resist to metastable atoms of a specific species must be determined through experimentation, because of unknowns such as the number of secondary electrons produced by the metastable atoms, the energy distribution of these secondaries, and their depth of penetration into the resist layer. Suitable resists may be selected by experimental measurement of metastable rare gas atom sensitivity. Likely resist candidates, such as Shipley SAL605, can be determined by considering electron beam sensitivity as described in Example 1. This is considered the most analogous process for which data is available. Other electron beam resists such as Shipley PMMA or PBS, while less sensitive to high energy electrons than SAL605, may prove more sensitive to metastable rare gas atoms. Moreover, even though sensitivities of commercial electron resists are quoted for high energy electrons (>10 keV), it is reasonable to assume that the quoted sensitivities are lower limits because low energy electrons generally create more secondary electrons than high energy ones.

In another embodiment of the invention, the metastable atom-based lithographic processes are used in conjunction with techniques for manipulation of neutral atom beams, known as atom optics. Most atom optic devices involve optical pumping with a laser beam. Metastable He, Ne and Ar are optically pumpable at 1.08 m or 389 nm (He), 640 nm (Ne) and 811 nm (Ar); Kr can be pumped at 811 nm, and Xe can be pumped at 882 nm. Preferably, the lithographic processes utilized are (1) contact lithography with a broad, collimated beam of metastables or a dilute gas of metastables or (2) scanned lithography, in which a finely focused beam of metastables is scanned across the resist surface in a manner analogous to electron or ion beam lithography.

FIG. 1 shows a contact lithography process in which a metastable atom source 1 is used for resist exposure. A metastable atom beam 5 is directed toward a substrate 7 on which a resist 9 has been applied. A pattern is formed using a mask 11 placed over the resist 9. The mask is typically placed at a distance of 1 $\mu$m from the surface of the resist. Collimation or focusing of the atom beam 5 is achieved using a collimation apparatus 3 which directs transverse diverging laser beams toward the atom beam 5 to collimate the beam 5 before the atoms strike the resist 9. The lasers are placed anywhere from 1 m before the mask 11 to directly before the mask 11, or even after the mask 11, depending on the degree of collimation desired. By collimating the atom beam 5, divergence of the atoms in the region between the mask 11 and the resist 9 can be reduced, thereby minimizing the broadening of the features which are to be transferred from the mask 11 to the substrate 7, and effectively reducing the minimum feature size. Focusing of the atoms can increase the flux at the resist 9, which in turn, increases dosage, reduces exposure time, and ultimately increases microchip throughput.

Figure 2:
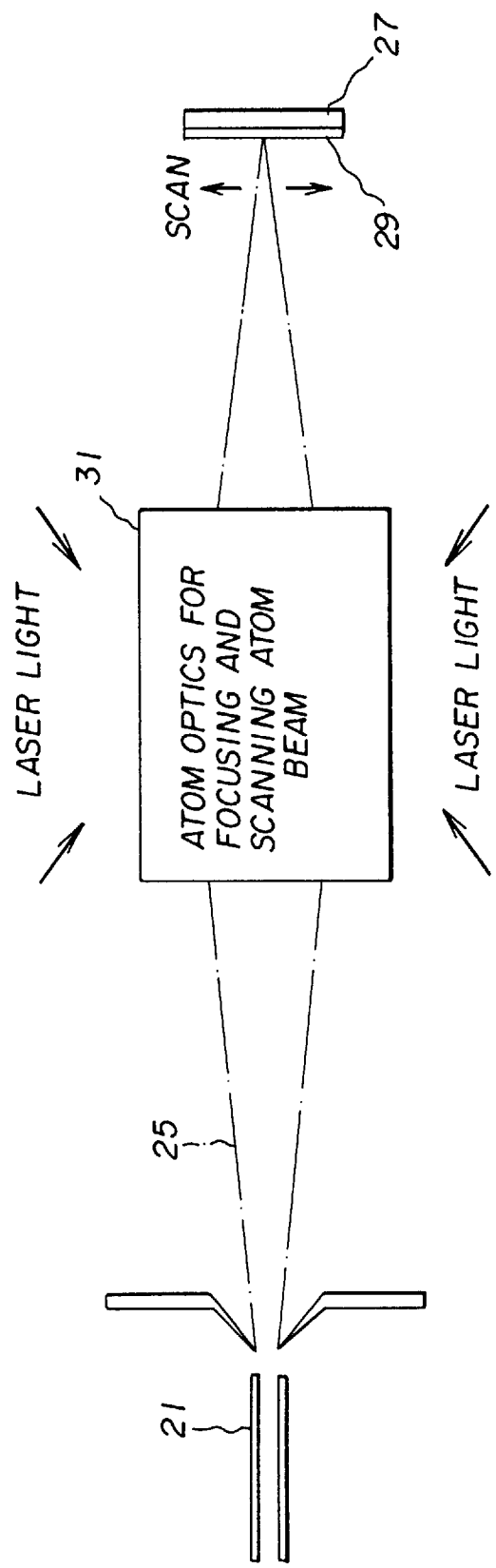
FIG. 2 shows a contact lithography process using metastable rare gas atoms.

FIG. 2 shows a scanned lithography process in which a metastable atom source 21 is utilized for resist 29 exposure. A pattern is formed by directing a finely focused metastable atom beam 25 toward a substrate 27 on which the resist 29 has been deposited. Atom optics 31 are utilized for focusing and scanning the beam 25. The atom optics 31 comprise an arrangement of laser beams which are intersected with the atom beam 25 with appropriately selected frequency and spatial distributions to effect deflection and focusing of the atom beam 25. The location of the laser beam arrangement is chosen to be anywhere from 1 mm to 1 m from the resist 29 surface, depending on the focusing and deflecting power of the lasers and the desired spot size and scan range. The spot size and scan range are determined by details of the atom optics configuration, such as the number of laser beams and their intensities, spatial distributions, and frequency content.

Other techniques for improving performance of the metastable rare gas beams include, but are not limited to, collimation and monochromization of the atom beam by laser cooling, creation of an "atomic funnel", and deflection of the atom beam before an aperture for the lithographic mask in order to modulate the beam intensity.

There are numerous advantages associated with the use of metastable rare gas atoms for lithographic processes. For example, metastable rare gas atoms at thermal velocities have very short De Broglie wavelengths, on the order of 0.01 nm, so image degradation due to the diffraction limit is not significant. In addition, metastable rare gas atoms are neutral, so there is no Coulomb repulsion limiting the beam density. Very high collimation can be achieved with atom optic techniques, permitting greater mask-substrate distance in contact lithography. This high collimation can be achieved along with an increase in intensity, rather than at the expense of intensity. Little or no scattering effects are expected in contrast to electron and ion beam lithographies. Moreover, spot sizes as small as the finest electron beam features may be obtained.

EXAMPLE 1

Using a Shipley resist, SAL605, having an electron beam sensitivity of 2 $\mu$C-cm$^{-2}$ at 20 keV, and assuming one electron per metastable atom and ignoring the difference in energies (20 keV vs. 20 eV), the number of metastable rare gas atoms per square centimeter to which this dosage would correspond is calculated as $1.25 \times 10^{13}$ electrons-cm$^{-2}$ given that the charge on one electron is $1.6 \times 10^{-13}$ $\mu$C. The exposure time necessary to achieve this dosage with a typical metastable rare gas source is then calculated using the following logic: At a distance of 50 cm from a typical unfocused source having a flux of $4 \times 10^{14}$ atoms-sr$^{-1}$s$^{-1}$, the solid angle subtended by 1 cm$^{-2}$ is $4 \times 10^{-4}$ sr. Thus, the flux at this distance is $1.6 \times 10^{11}$ atoms-cm$^{-2}$-s$^{-1}$ and the required dosage may be obtained in 78 seconds.

Although the present invention has been described relative to specific exemplary embodiments thereof, it will be understood by those skilled in the art that variations and modifications can be effected in these exemplary embodiments without departing from the spirit and scope of the invention.

I claim:

1. A lithography process for defining features on a workpiece comprising directing a beam of metastable rare gas atoms onto a surface of a lithographic resist so that the metastable rare gas atoms strike the surface of said lithographic resist whereby internal energy of said metastable rare gas atoms is released.

2. The process of claim 1 wherein said step of directing is performed for a time period of 10 seconds to 1 hour at a dosage of $10^{13}$ to $10^{14}$ metastable atoms per square centimeter.

3. The process of claim 1 wherein said beam of metastable rare gas atoms is generated in a DC discharge.

4. The process of claim 1 further comprising at least one of the following steps of collimating, focusing or scanning said beam.

5. The process of claim 4 wherein said steps of collimating, focusing or scanning are performed using at least one laser beam.

* * * * *